(12) United States Patent
Ryu et al.

(10) Patent No.: US 8,867,299 B2
(45) Date of Patent: Oct. 21, 2014

(54) NON-VOLATILE MEMORY DEVICE

(75) Inventors: Je Il Ryu, Seoul (KR); Duck Ju Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 317 days.

(21) Appl. No.: 13/488,207

(22) Filed: Jun. 4, 2012

(65) Prior Publication Data
US 2013/0070552 A1 Mar. 21, 2013

(30) Foreign Application Priority Data
Sep. 21, 2011 (KR) .................. 10-2011-0095083

(51) Int. Cl.
*G11C 11/00* (2006.01)
*G11C 8/14* (2006.01)

(52) U.S. Cl.
CPC .................................. *G11C 8/14* (2013.01)
USPC ................... 365/230.03; 365/63; 365/230.06

(58) Field of Classification Search
CPC ........... G11C 8/12; G11C 7/18; G11C 7/1006
USPC ............. 365/230.03, 230.06, 63, 189.09
See application file for complete search history.

(56) References Cited

U.S. PATENT DOCUMENTS

| 7,315,472 | B2 | 1/2008 | Lee | |
| 7,577,032 | B2* | 8/2009 | Umezawa | 365/185.13 |
| 7,800,955 | B2* | 9/2010 | Won et al. | 365/185.22 |

* cited by examiner

*Primary Examiner* — Son Dinh
(74) *Attorney, Agent, or Firm* — William Park & Associates Patent Ltd.

(57) ABSTRACT

A non-volatile memory device includes a plurality of memory blocks, first block switches configured to correspond to the respective odd-numbered memory blocks of the plurality of memory blocks and couple the word lines of the odd-numbered memory blocks and first local lines, second block switches configured to correspond to the respective even-numbered memory blocks of the plurality of memory blocks and couple the word lines of the even-numbered memory blocks and second local lines, a local line switch unit configured to selectively couple the first local lines or the second local lines and global word lines, and a high voltage generator configured to supply operating voltages to the global word lines.

17 Claims, 6 Drawing Sheets

231A

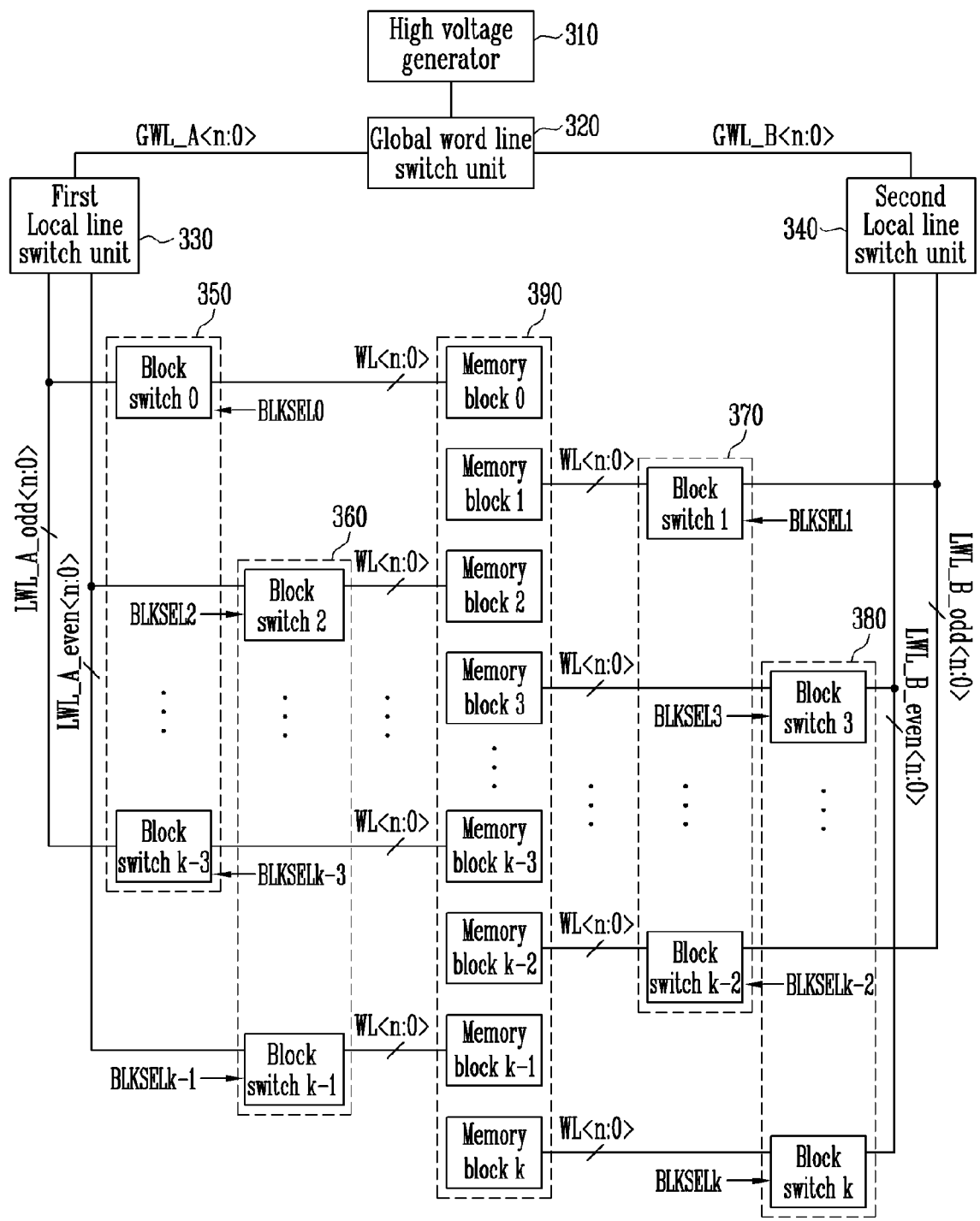

NON-VOLATILE MEMORY DEVICE

CROSS-REFERENCE TO RELATED APPLICATION

Priority is claimed to Korean patent application number 10-2011-0095083 filed on Sep. 21, 2011, the entire disclosure of which is incorporated herein by reference in its entirety.

BACKGROUND

1. Technical Field

Exemplary embodiments relate generally to a semiconductor memory device and, more particularly to a semiconductor memory device capable of reducing the load of a charge pump circuit.

2. Related Art

A semiconductor such as a non-volatile memory device requires a plurality of operating voltages (e.g., a program voltage, a read voltage, an erase voltage and a pass voltage) in a program operation, a read operation and an erase operation.

The operating voltages, higher than an external power source, are generated from the external power source at the charge pump circuit.

The size of a pump capacitor occupying most areas of the pump circuit is determined according to a load seen by the pump circuit. The load seen by the pump circuit may include a load due to global word lines, a load due to local lines, an a load due to the junction capacitor of a pass transistor within a row decoder corresponding to each of memory blocks.

BRIEF SUMMARY

Exemplary embodiments relate to a semiconductor memory device in which block switches corresponding to respective memory blocks are classified into a first group and a second group, first local lines are coupled to the block switches of the first group, and second local lines are coupled to the block switches of the second group, so that an operating voltage is transferred to the first local lines or the second local lines when one memory block is selected.

A semiconductor memory device according to an aspect of the present disclosure includes a plurality of memory blocks, first block switches configured to correspond to the respective odd-numbered memory blocks of the plurality of memory blocks and to couple the word lines of the odd-numbered memory blocks and first local lines, second block switches configured to correspond to the respective even-numbered memory blocks of the plurality of memory blocks and to couple the word lines of the even-numbered memory blocks and second local lines, a local line switch unit configured to selectively couple the first local lines or the second local lines and global word lines, and a high voltage generator configured to supply operating voltages to the global word lines.

A semiconductor memory device according to another aspect of the present disclosure includes a memory plane configured to include a plurality of memory blocks horizontally arranged, first and second block switch units and third and fourth block switch units disposed on both sides of the memory plane, respectively, and configured to couple the first to fourth local line groups and the word lines of the plurality of memory blocks, a first local line switch unit configured to couple a first global word line group and the first local line group or the second local line group, a second local line switch unit configured to couple a second global word line group and the third local line group or the fourth local line group, a high voltage generator configured to generate operating voltages, and a global word line switch unit configured to supply the operating voltages to the first global word line group or the second global word line group.

A semiconductor memory device according to another aspect of the present disclosure includes a plurality of memory blocks, a high voltage generator configured to generate operating voltages, a global word line switch unit configured to transfer the operating voltages to one of a plurality of global word line groups, a plurality of local line switch units configured to correspond to the respective global word line groups and to couple one of the global word line groups and one of the plurality of local word line groups, and a plurality of block switch units configured to correspond to the plurality of local word line groups and to couple relevant groups of the plurality of the local word line groups and word lines of relevant memory blocks of the plurality of the memory blocks.

BRIEF DESCRIPTION OF THE DRAWINGS

FIG. 6 shows the configuration of a semiconductor memory device according to an exemplary embodiment of present invention.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
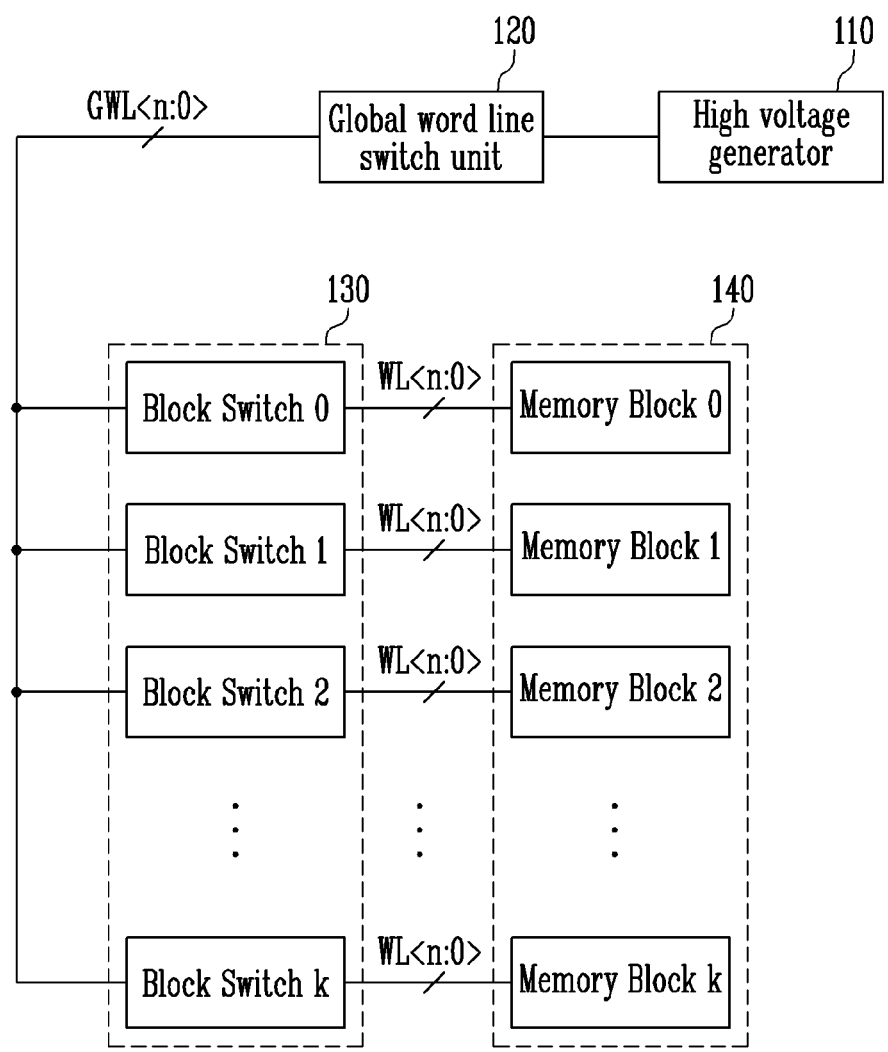
FIG. 1 shows a configuration of a semiconductor memory device according to an embodiment of the present invention.

FIG. 1 shows a configuration of a semiconductor memory device according to an embodiment of the present invention.

Figure 2:
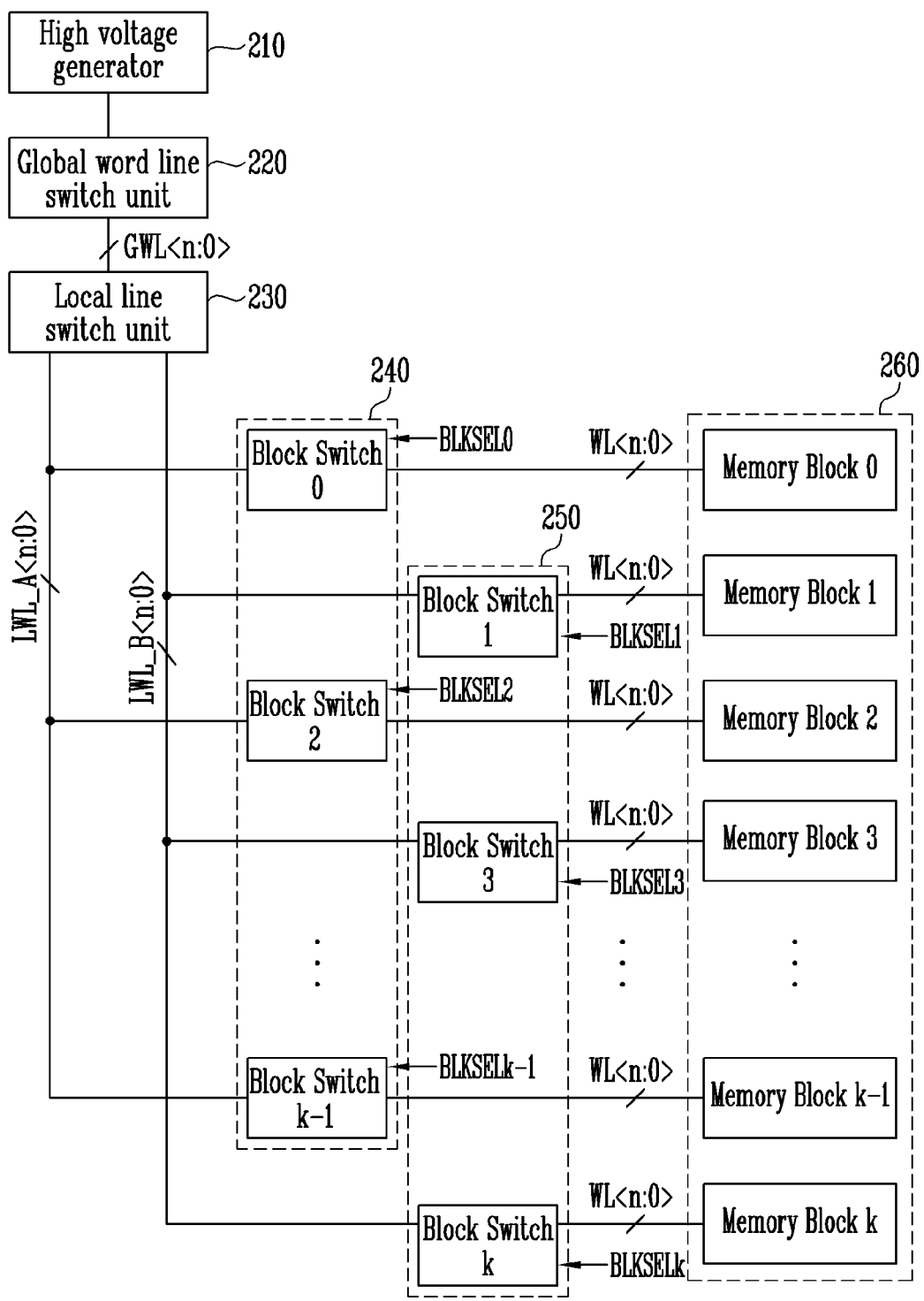
FIG. 2 shows the configuration of a semiconductor memory device according to an exemplary embodiment of the present invention.

Referring to FIG. 2, the semiconductor memory device includes a high voltage generator 110, a global word line switch unit 120, a block switch unit 130 and a memory block unit 140.

A high voltage (e.g., a program voltage) generated at the high voltage generator 110 is transferred to a plurality of global word lines GWL<n:0> via the global word line switch unit 120.

The plurality of global word lines GWL<n:0> is coupled to a first block switch Block Switch 0, a second block switch Block Switch 1, . . . , a (k+1)th block switch Block Switch k, respectively, included in the block switch unit 130. Each block switch of the block switch unit 130 corresponds to each of a first memory block Memory Block 0, a second memory block Memory Block 1, . . . , a (k+1)th memory block Memory Block k, respectively, included in the memory block unit 140. The block switches of the block switch unit 130 couple the global word lines GWL<n:0> and the word lines WL<n:0> of the respective memory blocks Memory Block 0, Memory Block 1, . . . and Memory Block k.

As described above, all the block switches Block Switch 0, Block Switch 1, . . . , Block Switch k are coupled to the global word lines GWL<n:0>. As semiconductor memory devices become more highly integrated, capacitances, including the junction capacitances of transistors, seen by the pump circuit increase, thereby increasing a load of the output terminal of the high voltage generator 110. If the load of the output terminal of the high voltage generator 110 increases, the area of the high voltage generator 110 may increase due to the size of the pump capacitor.

FIG. 2 shows the configuration of a semiconductor memory device according to an exemplary embodiment of the present invention.

Referring to FIG. 2, the semiconductor memory device includes a high voltage generator 210, a global word line switch unit 220, a local line switch unit 230, a first block switch unit 240, a second block switch unit 250 and a memory block unit 260.

The memory block unit 260 includes a first memory block Memory Block 0, a second memory block Memory Block 1, . . . , a (k+1)th memory block Memory Block k.

The high voltage generator 210 generates a plurality of operating voltages (e.g., a program voltage, a pass voltage, a read voltage and a verify voltage) which are necessary for the program operation, the read operation and the verify operation of the semiconductor memory device. The high voltage generator 210 includes a plurality of high voltage pump circuits. Each of the high voltage pump circuits includes a pump capacitor.

The global word line switch unit 220 selectively supplies a plurality of global word lines GWL<n:0> with the plurality of operating voltages generated at the high voltage generator 210.

The local line switch unit 230 couples the plurality of global word lines GWL<n:0> to a plurality of first local lines LWL_A<n:0> or a plurality of second local lines LWL_B<n:0>.

The first block switch unit 240 includes a first block switch Block Switch 0, a third block switch Block Switch 2, . . . , a kth block switch Block Switch k−1. The first block switch Block Switch 0, the third block switch Block Switch 2, . . . , the kth block switch Block Switch k−1 correspond to the respective even-numbered memory blocks of the memory block unit 260. Each of the first block switch Block Switch 0, the third block switch Block Switch 2, . . . , the kth block switch Block Switch k−1 includes a plurality of high voltage transistors. The first block switch Block Switch 0, the third block switch Block Switch 2, . . . , the kth block switch Block Switch k−1 couple the first local lines LWL_A<n:0> and the word lines WL<n:0> of the even-numbered memory blocks Memory Block 0, Memory Block 2, . . . , Memory Block k−1 in response to respective block select signals BLKSEL0, BLKSEL2, . . . , BLKSELk−1.

The second block switch unit 250 includes a second block switch Block Switch 1, a fourth block switch Block Switch 3, . . . , a (k+1)th block switch Block Switch k. The block switch 1, the block switch 3, . . . , the block switch k correspond to the respective odd-numbered memory blocks of the memory block unit 260. Each of the second block switch Block Switch 1, the fourth block switch Block Switch 3, . . . , the (k+1)th block switch Block Switch k includes a plurality of high voltage transistors. The block switch 1, the block switch 3, . . . , the block switch k couple the second local lines LWL_B<n:0> and the word lines WL<n:0> of the odd-numbered memory block 1, memory block 3, . . . , memory block k in response to respective block select signals BLKSEL1, BLKSEL3, . . . , BLKSELk.

Figure 3:
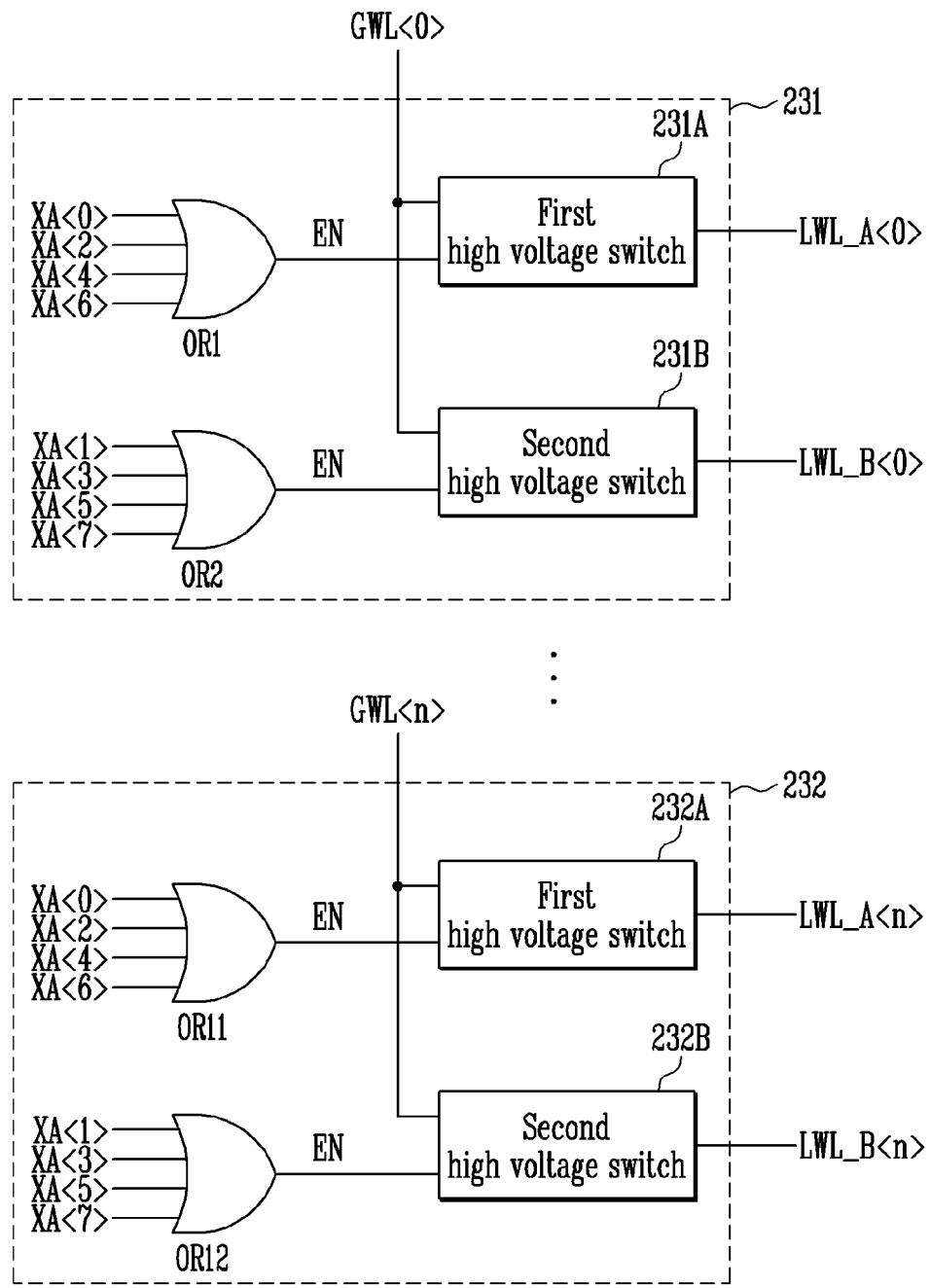
FIG. 3 shows the configuration of a local line switch unit shown in FIG. 2.

FIG. 3 shows the configuration of the local line switch unit 230 shown in FIG. 2.

Referring to FIG. 3, the local line switch unit 230 includes a plurality of switch units 231, 232 coupled to the respective global word lines GWL<n:0>.

The plurality of switch units 231, 232 may have a similar configuration, and thus the switch unit 231 coupled to the global word line GWL<0> is described as an example.

The switch unit 231 includes a first high voltage switch 231A, a second high voltage switch 231B, a first OR gate OR1 and a second OR gate OR2.

The first OR gate OR1 generates a first enable signal EN in response to pre-decoding address signals XA<0>, XA<2>, XA<4> and XA<6>, corresponding to the respective even-numbered memory blocks, among a plurality of pre-decoding address signals. That is, the first OR gate OR1 generates the first enable signal EN of a high level when at least one of the pre-decoding address signals XA<0>, XA<2>, XA<4> and XA<6> has a high level. In other words, if a memory block selected from among the plurality of memory blocks is an even-numbered memory block, the first OR gate OR1 generates the first enable signal EN of a high level.

The second OR gate OR2 generates a second enable signal EN in response to pre-decoding address signals XA<1>, XA<3>, XA<5> and XA<7> corresponding to the respective odd-numbered memory blocks, among the plurality of pre-decoding address signals. That is, the second OR gate OR2 generates the second enable signal EN of a high level when at least one of the pre-decoding address signals XA<1>, XA<3>, XA<5> and XA<7> has a high level. In other words, if a memory block selected from among the plurality of memory blocks is an odd-numbered memory block, the second OR gate OR2 generates the second enable signal EN of a high level.

The first high voltage switch 231A couples the global word line GWL<0> and the first local line LWL_A<0> in response to the first enable signal EN generated at the first OR gate OR1.

The second high voltage switch 231B couples the global word line GWL<0> and the second local line LWL_B<0> in response to the second enable signal EN generated from the second OR gate OR2.

The first high voltage switch 231A and the second high voltage switch 231B may have a similar configuration. Accordingly, the first high voltage switch 231A is described below as an example.

Figure 4:
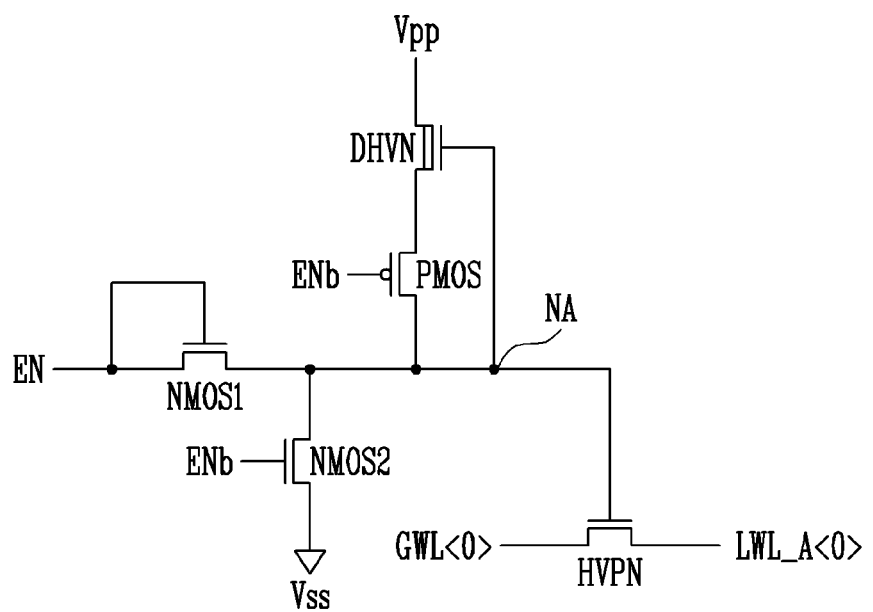
FIG. 4 is a detailed circuit diagram of a first high voltage switch shown in FIG. 3.

FIG. 4 is a detailed circuit diagram of the first high voltage switch 231A shown in FIG. 3.

Referring to FIG. 4, the first high voltage switch 231A includes NMOS transistors NMOS1 and NMOS2, a PMOS transistor PMOS, a depletion transistor DHVN, and a high voltage transistor HVPN.

The NMOS transistor NMOS1 is coupled between a node to which the first enable signal EN is inputted and is configured to raise the voltage level of the control node NA to a voltage level of the output node of the NMOS transistor NMOS1 turned on in response to the first enable signal EN. The NMOS transistor NMOS2 is coupled between the control node NA and a ground voltage (Vss) terminal and is configured to discharge the control node NA in response to an inverse enable signal ENb having an inverse relation with the first enable signal EN. For example, when the first enable signal EN of a high level is received, the voltage level of the control node NA becomes equal to the voltage level of the first enable signal EN if voltage drop at the NMOS transistor NMOS1 is not considered. When the first enable signal EN of a low level is received, the voltage level of the control node NA becomes equal to the ground voltage Vss.

The depletion transistor DHVN and the PMOS transistor PMOS are coupled in series between a high voltage supply (Vpp) terminal and the control node NA. The depletion transistor DHVN may be a depletion high voltage NMOS transistor. The depletion transistor DHVN is turned on in response to the voltage level of the control node NA and the PMOS transistor PMOS is turned on in response to the inverse enable signal ENb, so that the high voltage Vpp is supplied to the control node NA. Here, the high voltage Vpp can be supplied to the control node NA without a voltage drop (or with minimized voltage drop) because the depletion transistor DHVN has a negative threshold voltage.

The high voltage transistor HVPN is coupled between the global word line GWL<0> and the first local line LWL_A<0> and is turned on in response to the voltage level of the control node NA, thus coupling the global word line GWL<0> and the first local line LWL_A<0>.

Figure 5:
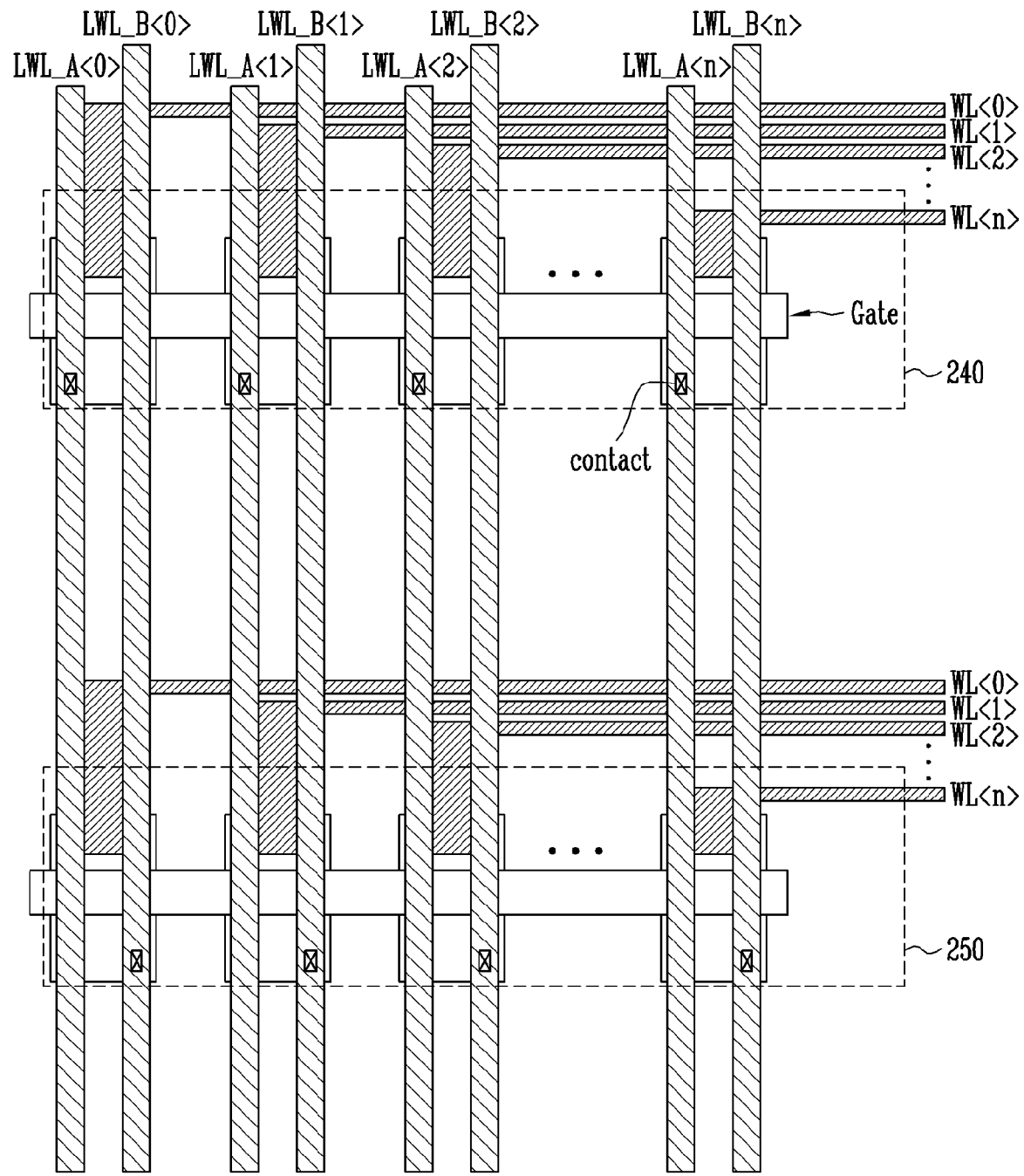
FIG. 5 is a layout diagram of block switch units according to an embodiment of present invention.

FIG. 5 is a layout diagram of the block switch units according to an embodiment of the present invention.

Referring to FIG. 5, first block switch unit 240 couples the first local lines LWL_A<n:0> and the respective word lines WL<n:0> of a relevant memory block (e.g., even-numbered memory blocks).

The operation of the semiconductor memory device is described below with reference to FIGS. 2 and 5.

An example of an operation of selecting the memory block<0> from the memory blocks of the memory block unit 260 and supplying a program voltage to the memory block<0> in a program operation is described below as an example.

In the program operation, the high voltage generator 210 generates a program voltage VPGM and a pass voltage VPASS.

The global word line switch unit 220 transfers the program voltage VPGM to a global word line (e.g., GWL<0>) selected from the plurality of global word lines GWL<n:0> and transfers the pass voltage VPASS to the remaining global word lines (e.g., GWL<n:2>).

The local line switch unit 230 couples the global word lines GWL<n:0> and the first local lines LWL_A<n:0>. Here, the local line switch unit 230 couples the global word lines GWL<n:0> and the first local lines LWL_A<n:0> by activating the first high voltage switches of the switch units 231, 232 in response to the pre-decoding signals corresponding to the memory block<0>.

The block switch<0> of the first block switch unit 240 couples the first local lines LWL_A<n:0> and the word lines WL<n:0> of the memory block<0> so that the program voltage VPGM and the pass voltage VPASS are supplied to the word lines WL<n:0> of the memory block<0>.

When one of the plurality of memory blocks is selected and the operating voltages are supplied to the selected memory block as described above, each of the number of local word lines coupled to the global word lines GWL<n:0> and the number of block switches coupled to the local word lines can be reduced by half, so that a load of the output terminal of the high voltage generator 210, e.g., a load seen by the high voltage generator 210 can be reduced. If the load of the output terminal of the high voltage generator 210 is reduced as described above, the area of the semiconductor memory device can be reduced because the size of the pump capacitor included in the high voltage generator 210 can be reduced.

FIG. 6 shows the configuration of a semiconductor memory device according to another exemplary embodiment of the present invention.

Referring to FIG. 6, the semiconductor memory device includes a high voltage generator 310, a global word line switch unit 320, first and second local line switch units 330 and 340, first to fourth block switch units 350 to 380, and a memory block unit 390.

The memory block unit 390 includes a memory block 0 to a memory block k.

The high voltage generator 310 generates a plurality of operating voltages (e.g., a program voltage, a pass voltage, a read voltage and a verify voltage) which are necessary for the program operation, the read operation and the verify operation of the semiconductor memory device. The high voltage generator 310 includes a plurality of high voltage pump circuits, and each of the high voltage pump circuits includes a pump capacitor.

The global word line switch unit 320 transfers the plurality of operating voltages of the high voltage generator 310 to first global word lines GWL_A<n:0> or second global word lines GWL_B<n:0>.

The first local line switch unit 330 couples the first global word lines GWL_A<n:0> and a plurality of first local lines LWL_A_odd<n:0> or a plurality of second local lines LWL_A_even<n:0>.

The second local line switch unit 340 couples the second global word lines GWL_B<n:0> and a plurality of third local lines LWL_B_odd<n:0> or a plurality of fourth local lines LWL_B_even<n:0>.

Each of the first local line switch unit 330 and the second local line switch unit 340 may have the same configuration as the local line switch unit 230 of FIG. 3.

The first and the second block switch units 350 and 360 are arranged, for example, on one side of the memory block unit 390. The first block switch unit 350 includes a block switch 0, ..., a block switch k–3, and the second block switch unit 360 includes a block switch 2, ..., a block switch k–1. That is, each of the first and the second block switch units 350 and 360 includes half the number of block switches corresponding to the even-numbered memory blocks of the memory block unit 390. The first block switch unit 350 couples the first local lines LWL_A_odd<n:0> and the word lines WL<n:0> of relevant memory blocks in response to a plurality of block select signals BLKSEL0, ..., BLKSELk–3. The second block switch unit 360 couples the second local lines LWL_A_even<n:0> and the word lines WL<n:0> of relevant memory blocks in response a plurality of block select signals BLKSEL2, ..., BLKSELk–1.

The third and the fourth block switch units 370 and 380 are arranged, for example, on the other side of the memory block unit 390. The third block switch unit 370 includes a block switch 1, ..., a block switch k–2, and the fourth block switch unit 380 includes a block switch 3, ..., a block switch k. That is, each of the third and the fourth block switch units 370 and 380 includes half the number of block switches corresponding to the odd-numbered memory blocks of the memory block unit 390. The third block switch unit 370 couples the third local lines LWL_B_odd<n:0> and the word lines WL<n:0> of relevant memory blocks in response to a plurality of block select signals BLKSEL1, ..., BLKSELk–2. The fourth block switch unit 380 couples the fourth local lines LWL_B_even<n:0> and the word lines WL<n:0> of relevant memory blocks in response to a plurality of block select signals BLKSEL3, ..., BLKSELk.

The operation of the semiconductor memory device of FIG. 5 is described below.

An example of an operation of selecting the memory block<0> from the plurality of memory blocks of the memory block unit 390 and supplying a program voltage to the selected memory block in a program operation is described below.

In the program operation, the high voltage generator 310 generates a program voltage VPGM and a pass voltage VPASS.

The global word line switch unit 320 transfers the program voltage VPGM and the pass voltage VPASS to the first global word lines GWL_A<n:0>. More specifically, the program voltage VPGM is transferred to one global word line (e.g., GWL_A<0>) selected from the first global word lines GWL_A<n:0>, and the pass voltage VPASS is transferred to the remaining global word lines (e.g., GWL_A<n:2>).

The first local line switch unit 330 couples the first global word lines GWL_A<n:0> and the first local lines LWL_A_odd<n:0>.

The block switch<0> of the first block switch unit 350 couples the first local lines LWL_A_odd<n:0> and the word lines WL<n:0> of the memory block<0> so that the program voltage VPGM and the pass voltage VPASS are supplied to the word lines WL<n:0> of the memory block<0>.

When one of the plurality of memory blocks is selected and the operating voltages are supplied to the selected memory block as described above, each of the number of global word lines, local lines, and block switches coupled to the output terminal of the high voltage generator 310 is reduced by ¼, and thus a load of the output terminal of the high voltage generator 310 is reduced. If the load of the output terminal of the high voltage generator 310 is reduced as described above, the area of the semiconductor memory device can be reduced because the size of the pump capacitor included in the high voltage generator 310 is reduced.

In accordance with an embodiment of the present invention, the block switches corresponding to the respective memory blocks are classified into the first group and the second group, the block switches of the first group are coupled to the first local lines, and the block switches of the second group are coupled to the second local lines so that the operating voltages are transferred to the first local lines or the second local lines when a memory block is selected. Accordingly, a load of the output terminal of the high voltage generator for generating the operating voltages can be reduced.

What is claimed is:

1. A non-volatile memory device, comprising:
a plurality of memory blocks;
first block switches configured to correspond to respective odd-numbered memory blocks of the plurality of memory blocks and couple word lines of the odd-numbered memory blocks and first local lines;
second block switches configured to correspond to respective even-numbered memory blocks of the plurality of memory blocks and couple word lines of the even-numbered memory blocks and second local lines;
a local line switch unit configured to selectively couple the first local lines or the second local lines and global word lines; and
a high voltage generator configured to supply operating voltages to the global word lines.

2. The non-volatile memory device of claim 1, wherein when the semiconductor memory device is operated, an output terminal of the high voltage generator is coupled to the first local lines or the second local lines via the global word lines.

3. The non-volatile memory device of claim 1, wherein the local line switch unit couples the global word lines and the first local lines, respectively, or the global word lines and the second local lines, respectively, in response to a plurality of pre-decoding address signals.

4. The non-volatile memory device of claim 3, wherein:
the local line switch unit comprises a plurality of switch units coupled to the respective global word lines, and
each of the plurality of switch units couples one of the global word lines to one of the first local lines or one of the second local lines in response to the plurality of pre-decoding address signals.

5. The non-volatile memory device of claim 4, wherein each of the plurality of switch units comprises:
a first logic unit configured to generate a first enable signal in response to pre-decoding address signals, corresponding to the respective odd-numbered memory blocks, among the plurality of pre-decoding address signals;
a first high voltage switch configured to couple one of the global word lines and one of the first local lines in response to the first enable signal;
a second logic unit configured to generate a second enable signal in response to pre-decoding address signals, corresponding to the respective even-numbered memory blocks, among the plurality of pre-decoding address signals; and
a second high voltage switch configured to couple one of the global word lines and one of the second local lines in response to the second enable signal.

6. A non-volatile memory device comprising:
a memory block unit configured to include a plurality of memory blocks;
first and second block switch units and third and fourth block switch units arranged on both sides of the memory block unit, respectively, and configured to couple the first to fourth local line groups and word lines of the plurality of memory blocks;
a first local line switch unit configured to couple a first global word line group to the first local line group or the second local line group;
a second local line switch unit configured to couple a second global word line group to the third local line group or the fourth local line group;
a high voltage generator configured to generate operating voltages; and
a global word line switch unit configured to supply the operating voltages to the first global word line group or the second global word line group.

7. The non-volatile memory device of claim 6, wherein when the semiconductor memory device is operated, an output terminal of the high voltage generator is coupled to one of the first to fourth local line groups through the first or second global word line group.

8. The non-volatile memory device of claim 6, wherein:
the first and the second block switch units correspond to odd-numbered memory blocks of the plurality of memory blocks, and
the third and the fourth block switch units correspond to even-numbered memory blocks of the plurality of memory blocks.

9. The non-volatile memory device of claim 6, wherein the first local line switch unit couples the first global word line group and the first local line group or couples the first global word line group and the second local line group, in response to a plurality of pre-decoding address signals.

10. The non-volatile memory device of claim 9, wherein:
the first local line switch unit comprises a plurality of switch units coupled to the first global word line group, and each of the plurality of switch units couples one global word line of the first global word line group to one local line of the first local line group or one local line of the second local line group in response to the plurality of pre-decoding address signals.

11. The non-volatile memory device of claim 6, wherein the second local line switch unit couples the second global word line group and the third local line group or couples the second global word line group and the fourth local line group, in response to a plurality of pre-decoding address signals.

12. The non-volatile memory device of claim 11, wherein:
the second local line switch unit comprises a plurality of switch units coupled to the second global word line group, and
each of the plurality of switch units couples one global word line of the second global word line group to one local line of the third local line group or one local line of the fourth local line group in response to the plurality of pre-decoding address signals.

13. A non-volatile memory device comprising:
a plurality of memory blocks;
a high voltage generator configured to generate operating voltages;
a global word line switch unit configured to transfer the operating voltages to one of a plurality of global word line groups;
a plurality of local line switch units configured to correspond to the respective global word line groups and couple one of the global word line groups and one of the plurality of local word line groups; and
a plurality of block switch units configured to correspond to the plurality of local word line groups and couple relevant groups of the plurality of the local word line groups and word lines of relevant memory blocks of the plurality of the memory blocks.

14. The non-volatile memory device of claim 13, wherein when the semiconductor memory device is operated, an output terminal of the high voltage generator is coupled to one of the plurality of block switch units through one of the plurality of global word line groups and one of the plurality of local line groups.

15. The non-volatile memory device of claim 13, wherein each of the plurality of local line switch units couples one of the plurality of global word line groups and one of the plurality of local word line groups in response to plurality of pre-decoding address signals.

16. The non-volatile memory device of claim 15, wherein:
each of the plurality of local line switch units comprises a plurality of switch units coupled to one of the plurality of global word line groups, and
each of the plurality of switch units couples one global word line of the one global word line group to a first local line of a first one of the plurality of local line groups or a second local line of a second one of the plurality of local line groups in response to the plurality of pre-decoding address signals.

17. The non-volatile memory device of claim 16, wherein each of the plurality of switch units comprises:
a first logic unit for generating a first enable signal in response to pre-decoding address signals, corresponding to respective odd-numbered memory blocks of the plurality of memory blocks, among the plurality of pre-decoding address signals;
a first high voltage switch for coupling the one global word line and the first local line in response to the first enable signal;
a second logic unit for generating a second enable signal in response to pre-decoding address signals, corresponding to respective even-numbered memory blocks of the plurality of memory blocks, among the plurality of pre-decoding address signals; and
a second high voltage switch for coupling the one global word line and the second local line in response to the second enable signal.

* * * * *